(12) United States Patent
Cook et al.

(10) Patent No.: US 10,164,669 B2
(45) Date of Patent: Dec. 25, 2018

(54) HYBRID AMPLIFIER AND SIGNAL COMBINER

(71) Applicant: SKYWORKS SOLUTIONS, INC., Woburn, MA (US)

(72) Inventors: Mackenzie Brian Cook, Montreal (CA); John William Mitchell Rogers, Nepean (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/285,456

(22) Filed: Oct. 4, 2016

(65) Prior Publication Data

US 2017/0111065 A1 Apr. 20, 2017

Related U.S. Application Data

(60) Provisional application No. 62/242,955, filed on Oct. 16, 2015.

(51) Int. Cl.
| | |
|---|---|
| *H03F 3/193* | (2006.01) |
| *H04B 1/04* | (2006.01) |
| *H03F 3/21* | (2006.01) |
| *H03F 1/22* | (2006.01) |
| *H03F 1/32* | (2006.01) |
| *H03F 3/24* | (2006.01) |

(52) U.S. Cl.
CPC ........... *H04B 1/0475* (2013.01); *H03F 1/223* (2013.01); *H03F 1/3205* (2013.01); *H03F 3/193* (2013.01); *H03F 3/211* (2013.01); *H03F 3/245* (2013.01); *H03F 2200/111* (2013.01); *H03F 2200/294* (2013.01); *H03F 2200/333* (2013.01); *H03F 2200/451* (2013.01); *H03F 2200/75* (2013.01); *H04B 2001/0408* (2013.01)

(58) Field of Classification Search
CPC ..... H03F 1/26; H03F 3/04; H03F 3/21; H03F 3/191; H03F 3/193; H03F 3/211; H03F 2200/75; H03F 2200/294; H03F 2200/333; H03F 2200/451; H04B 1/04; H04B 1/10; H04B 1/0475; H04B 2001/0408
USPC ......... 330/31, 277, 284, 296, 302, 305, 311; 375/295–297; 455/285, 290, 302, 307, 455/333
See application file for complete search history.

(56) References Cited

U.S. PATENT DOCUMENTS

| | | | |
|---|---|---|---|
| 6,681,103 B1* | 1/2004 | Rogers | H03H 11/1213 455/285 |
| 2005/0110575 A1* | 5/2005 | Sivonen | H03F 1/223 330/302 |
| 2008/0012643 A1* | 1/2008 | Duperray | H03F 1/22 330/284 |
| 2009/0009250 A1* | 1/2009 | Satoh | H03F 1/26 330/277 |

(Continued)

*Primary Examiner* — Shawkat M Ali
(74) *Attorney, Agent, or Firm* — Chang & Hale LLP

(57) ABSTRACT

A radio-frequency module comprises a low-noise amplifier including a common source transistor having a gate node that receives a radio-frequency input signal and a drain node that transmits a combined radio-frequency output signal, and a correction signal input path configured to receive a correction signal and provide the correction signal to a source node of the common source transistor to generate, at least in part, the combined radio-frequency output signal.

18 Claims, 6 Drawing Sheets

(56) References Cited

U.S. PATENT DOCUMENTS

| | | | |
|---|---|---|---|
| 2012/0032743 A1* | 2/2012 | Hsieh | H03F 1/223 330/285 |
| 2013/0314164 A1* | 11/2013 | Din | H03F 1/0205 330/296 |
| 2015/0207531 A1* | 7/2015 | Vahid Far | H03F 1/56 455/304 |
| 2016/0036392 A1* | 2/2016 | Bohsali | H03F 1/26 375/340 |

* cited by examiner

HYBRID AMPLIFIER AND SIGNAL COMBINER

CROSS-REFERENCE TO RELATED APPLICATION(S)

This application claims priority to U.S. Provisional Application No. 62/242,955, filed Oct. 16, 2015, and entitled HYBRID AMPLIFIER AND SIGNAL COMBINER, the disclosure of which is hereby incorporated by reference in its entirety.

BACKGROUND

Field

The present disclosure relates to radio frequency signal processing.

Description of the Related Art

Amplifier devices can be used in processing radio frequency signals. Certain amplifier devices can generate undesirable distortion, which may affect system performance.

SUMMARY

In accordance with a number of implementations, the present disclosure relates to a radio-frequency module comprising a low-noise amplifier including a common source transistor having a gate node that receives a radio-frequency input signal and a drain node that transmits a combined radio-frequency output signal, and a correction signal input path configured to receive a correction signal and provide the correction signal to a source node of the common source transistor to generate, at least in part, the combined radio-frequency output signal.

In certain embodiments, no separate signal combiner is coupled to the gate node. The correction signal may be designed to cancel out an unwanted portion of the radio-frequency input signal. The radio-frequency module may further comprise a common gate transistor having a source node coupled to the gate node of the common source transistor and a drain node coupled to a radio-frequency output node. In certain embodiments, the correction signal path includes a buffer amplifier. The common source transistor may be a MOSFET transistor. In certain embodiments, the radio-frequency module further comprises a first inductor coupled to the gate node of the common source transistor and a second inductor coupled to the source node of the common source transistor in parallel with the correction signal input path.

In accordance with a number of implementations, the present disclosure relates to a radio-frequency circuit comprising a low-noise amplifier including a common source transistor having a gate node that receives a radio-frequency input signal and a drain node that transmits a combined radio-frequency output signal, and a correction signal input path configured to receive a correction signal and provide the correction signal to a source node of the common source transistor to generate, at least in part, the combined radio-frequency output signal.

In certain embodiments, no separate signal combiner is coupled to the gate node of the common source transistor. The correction signal may be designed to cancel out an unwanted portion of the radio-frequency input signal. The radio-frequency circuit may further comprise a common gate transistor having a source node coupled to the gate node of the common source transistor and a drain node coupled to a radio-frequency output node. In certain embodiments, the correction signal path includes a buffer amplifier. The common source transistor may be, for example, a MOSFET transistor. In certain embodiments, the radio-frequency circuit further comprises a first inductor coupled to the gate node of the common source transistor and a second inductor coupled to the source node of the common source transistor in parallel with the correction signal input path.

In some implementations, the present disclosure relates to a wireless device comprising an antenna configured to receive a radio-frequency input signal, a low-noise amplifier including a common source transistor having a gate node that receives the radio-frequency input signal and a drain node that transmits a combined radio-frequency output signal, correction signal generation circuitry configured to generate a correction signal designed to cancel out a noise component of the radio-frequency input signal, a correction signal input path configured to receive the correction signal and provide the correction signal to a source node of the common source transistor to generate, at least in part, the combined radio-frequency output signal, and a transceiver module configured to receive the combined radio-frequency output signal. In certain embodiments, no separate signal combiner is coupled to the gate node of the common source transistor.

In certain embodiments, the wireless device further comprises a common gate transistor having a source node coupled to the gate node of the common source transistor and a drain node coupled to a radio-frequency output node. The correction signal path may include a buffer amplifier. In certain embodiments, the common source transistor is a MOSFET transistor. The wireless device may further comprise a first inductor coupled to the gate node of the common source transistor and a second inductor coupled to the source node of the common source transistor in parallel with the correction signal input path.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION OF SOME EMBODIMENTS

The headings provided herein, if any, are for convenience only and do not necessarily affect the scope or meaning of the claimed invention.

Figure 1:
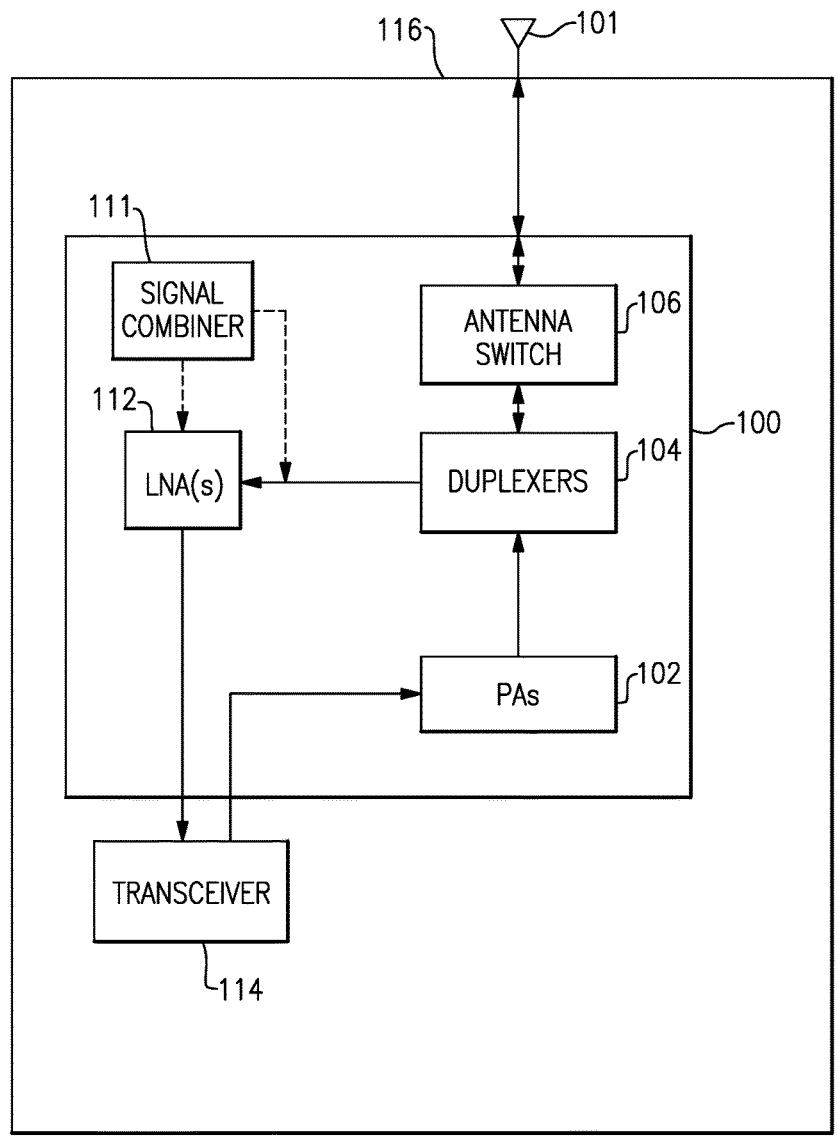
FIG. 1 shows a radio-frequency (RF) system, including RF circuitry and/or modules, implemented on a circuit board according to one or more embodiments.

FIG. 1 shows a radio-frequency (RF) system, including RF circuitry and/or modules, implemented on a circuit board 116 according to one or more embodiments. The system includes one or more low-noise amplifiers (LNAs) 112 configured to amplify a signal of interest received by the system over, for example, one or more antennas 101. The system may further include a signal combiner module or circuitry 111 configured to combine a noise cancelling signal in the received signal path to at least partially eliminate noise in the signal, such as noise generated by one or more other modules or devices of the system. Certain embodiments disclosed herein provide for combined LNA and signal combiner circuitry, which may provide certain benefits, as described in greater detail below.

FIG. 1 includes a radio-frequency (RF) module 100 including one or more duplexers 104. The RF module can also include a plurality of power amplifiers (PAs) 102 configured to amplify RF signals from a transceiver 114. An amplified RF signal can pass through a corresponding one of the duplexers 104, and be routed to an antenna 101 through an antenna switch 106. In some embodiments, the same antenna(s) 101 can be utilized to receive an RF signal, and such a received signal can be routed to a low-noise amplifier (LNA) 112 through a corresponding one of the duplexers 104. The amplified signal output from the LNA 112 is shown to be routed to the transceiver 114 for further processing.

One or more devices and/or modules (e.g., one or more of the power amplifiers 102) of the system may generate noise that may leak into one or more signals of interest, such as a receive signal intended to pass through the LNA(s) 112. When such interference can be identified, the signal may be manipulated or otherwise used to generate a cancelling signal, which may be combined with the received signal at some point in the receive path. For example, the amplitude and/or phase of the undesired signal may be effectively inversely matched to generate the cancellation signal such that a combination of the cancellation signal with the transmission signal results in a cleaner signal.

Figure 2:
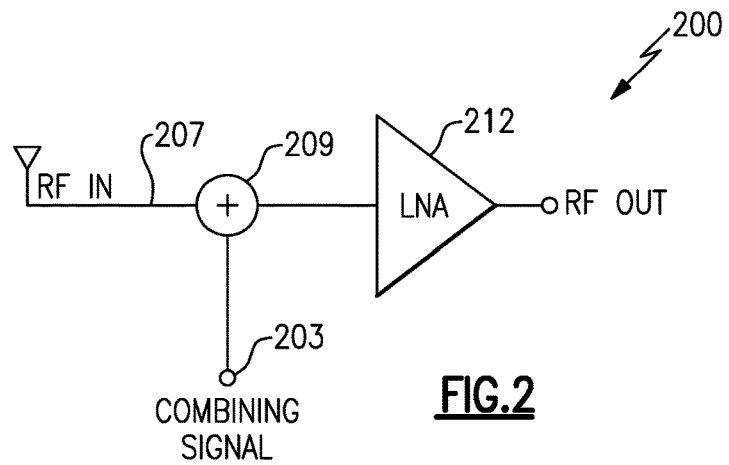
FIG. 2 is a circuit diagram representing RF circuitry including an RF signal combiner and an amplifier according to one or more embodiments.

FIG. 2 depicts RF circuitry 200 including an RF signal combiner 209 and an amplifier 212 according to one or more embodiments. The circuitry 200 includes a signal transmission path 207 carrying an RF input signal, and a low-noise amplifier (LNA) 212 for amplifying a signal of interest. In certain embodiments, the RF input signal is combined with a combining signal to produce the signal of interest. As described above, the RF input signal may include the desired signal, but also may include other undesired signals, such as certain locally-generated noise signals that may have leaked into the signal transmission path. In certain situations, it may be desirable for low-noise amplification to be performed on the combined signal including the transmission signal provided at RFIN and a noise-cancelling combining signal provided at port 203 in order to at least partially prevent the amplification of distortion inside the LNA 212. Where a large undesired signal is present at the RF input, a cancellation may be particularly desirable in order to prevent the signal from generating distortion. In an FET transistor LNA, distortion may occur when the input signal creates a gate-to-source voltage (VGS), allowing the LNA to attempt to amplify the signal beyond its linear range. Therefore, any combination for the purposes of cancellation may advantageously occur before a VGS can be generated in the LNA 212.

In certain embodiments, the RF signal combiner 209 may utilize a relatively large number of passive components (e.g., capacitors, inductors, etc.). In view of space and/or price concerns, it may be desirable to be able to perform the signal combination in a reduced area relative to the requirements of the circuit 200. Therefore, certain embodiments provide for the combination of the RF input signal and the combining/cancelling signal at the LNA, rather than utilizing a separate passive combiner. For example, the signals may both be applied to the LNA simultaneously at different nodes.

Hybrid Amplifier and Signal Combiner

Figure 3:
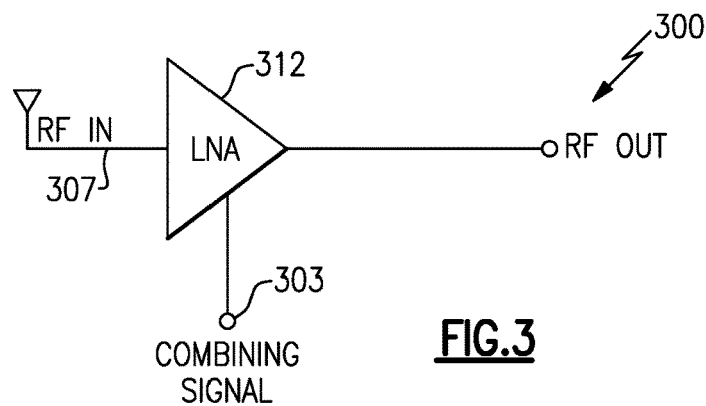
FIG. 3 is a circuit diagram representing RF circuitry including an amplifier combined with a signal combiner according to one or more embodiments.

As described above, it may be desirable to provide low-noise amplification to a combined signal in order to prevent amplification of undesired noise. As an alternative to embodiments disclosed above in which signal combining is performed using an RF combiner prior to the low-noise amplifier (LNA) in the signal path, FIG. 3 is a block diagram representing RF circuitry 300 including an amplifier combined with a signal combiner according to one or more embodiments. The circuitry 300 of FIG. 3 includes an RF input signal line 307, an LNA 312, a combining signal port 303, and an RF output port. In certain embodiments comprising a FET transistor LNA, the combining signal may be provided at a source of one of one or more transistors of the LNA.

The configuration of the circuitry 300 may at least partially prevent an undesired signal from entering the LNA and being amplified by injecting a copy or variation of a known undesired signal on the transistor gate into the source, which may resulting in substantially no VGS. The cancelation may occur before the transistor amplifies the signal, preventing the need to design the LNA to handle additional input power associated with the RF input signal distortion.

Figure 4:
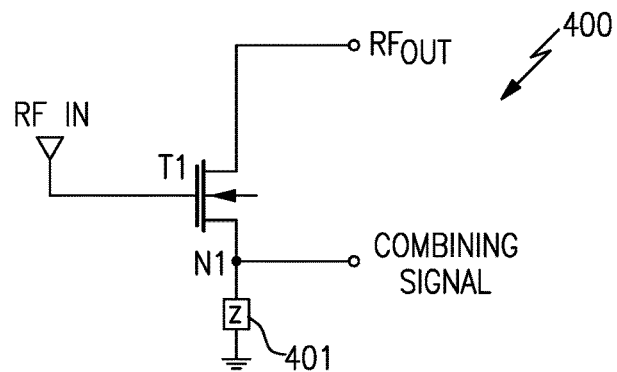
FIG. 4 is a circuit diagram representing RF circuitry including a transistor amplifier combined with a signal combiner according to one or more embodiments.

FIG. 4 is a circuit diagram representing RF circuitry 400 including a transistor amplifier T1 combined with a signal combiner according to one or more embodiments. In certain embodiments, the signal to be combined with the RF input is effectively injected into the signal path using the source terminal of one or more transistors of the LNA prior to amplification by the LNA and in a manner that at least partially avoids loading the input of the LNA and degrading receive noise. While certain transistors are described herein with reference to source and/or drain nodes, it should be understood that such embodiments may be implemented in configurations where references to a source may be instead the drain, and vice versa. That is, any reference to, or description of, a source of a transistor may be representative of a drain, and vice versa. An impedance 401, such as one or more inductors and/or capacitors, may be connected between the source of T1 and ground.

Although certain embodiments are described herein in the context of FET-based LNAs, it should be understood that principles disclosed herein may be applicable in other types of LNA devices, such as bipolar junction transistor (BJT)-based LNAs, for example. For example, the combining signal may be injected into an emitter of a BJT amplifier.

Figure 5:
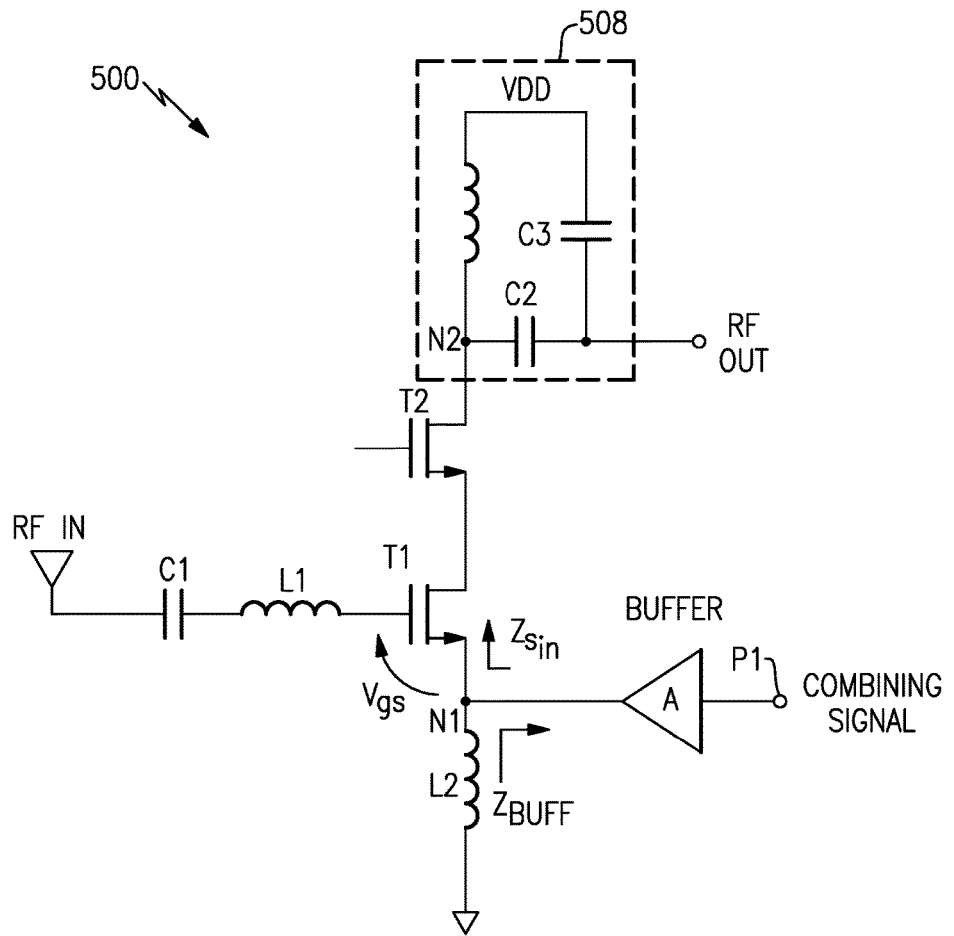
FIG. 5 is a circuit diagram representing RF circuitry including an LNA and a signal combiner according to one or more embodiments.

FIG. 5 is a circuit diagram representing RF circuitry 500 including an LNA including a signal combiner according to one or more embodiments. The circuitry 500 includes a cascode LNA comprising a common source transistor T1 and a common gate transistor T2. Although a cascode amplifier having two transistors T1, T2 is shown, it should be understood that various other amplifier configurations are possible having any desirable or practical number of transistors. The cascode configuration may provide advantageous input-output isolation, input and/or output impedance, gain, and/or bandwidth characteristics. An RF input signal may be provided at the gate of the common source transistor T1, which may be matched with a gate inductor L1 and/or a source inductor L2. The output signal may be supplied at an output tank 508 connected to a drain node N2 of the common gate transistor T2.

A combining signal port P1 is connected to the source of the common source transistor T1. In certain embodiments, a buffer stage (e.g., source follower) output is injected into the source of the transistor T1. The buffer may be omitted in certain embodiments. The buffer may be implemented to present a substantially constant, pre-defined impedance to the source of the driver transistor T1 to create a desired coupling coefficient when loaded with, for example, a source inductor L2 and/or source of the LNA.

By connecting the combining signal (e.g., with or without a buffer), and applying a signal into a source of the transistor T1 while substantially simultaneously injecting a signal into the gate of the transistor, the circuit 500 may result in the creation of two separate gate-to-source voltage signals that effectively sum together. In certain embodiments, an undesired frequency component of the RF input signal may effectively sum to be zero, leaving only the desired signal as output of the amplifier.

In certain embodiments, output circuitry 508 is coupled to the output drain of the transistor T2, which may serve to at least partially enable an output match while maintaining a desirable level of gain. Although certain output circuitry elements are illustrated, it should be understand that output circuitry may have any desirable components/elements or configuration, or may be omitted, within the scope of the present disclosure. For example, the output circuitry 508 may instead comprise a simple resistive and/or inductive load, or any other series or parallel elements or buffer circuitry. In the illustrated embodiments, the capacitors C2, C3 may form a voltage divider for impedance matching purposes.

While various passive and/or active circuit elements are shown, any of such elements may be omitted in certain embodiments, and further additional passive and/or active elements may be included in various embodiments. The circuitry 500 may include a DC blocking capacitor C1 on the RF input line. Gate (L1) and/or source (L2) inductors may further be included for providing simultaneous noise/input matching. For example, the gate inductor L1 and the source inductor L2 may provide a 50 ohm match at the input of the amplifier. In certain embodiments, the circuitry 500 includes a source resistor (not shown) in addition to, or instead of, the inductor L2.

The buffer stage may serve to buffer impedance variations at the input of the buffer, such as from a phase shifter or attenuator, for example, in order to present a substantially constant impedance to the LNA and/or prevent significant variations in performance of the LNA. In certain embodiments, the buffer is omitted. The buffer may comprise one or more FET transistors and/or capacitors, among possibly other elements. As described above, in certain embodiments, no separate signal combiner is provided in front of the LNA 500 in the signal path.

Figure 6:
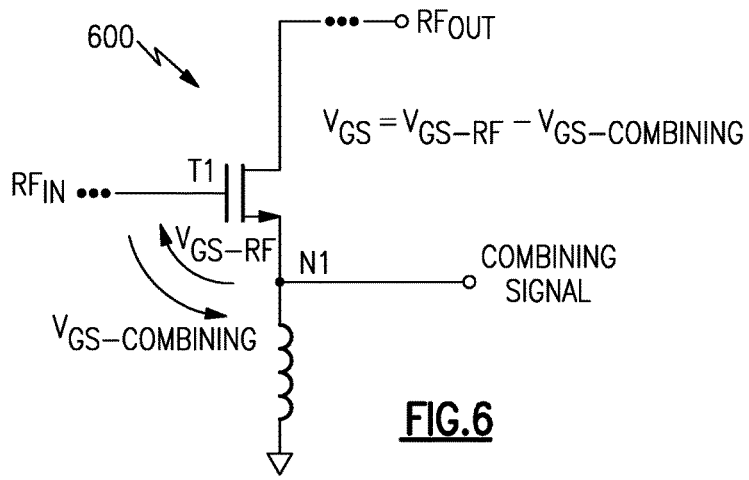
FIG. 6 is a circuit diagram representing RF circuitry including an amplifier combined with a signal combiner according to one or more embodiments.

FIG. 6 is a circuit diagram representing RF circuitry including an amplifier combined with a signal combiner according to one or more embodiments. The diagram of FIG. 6 shows how the combined signal including the RF input signal and the combining signal may be seen as the gate-to-source voltage (VGS) formed from the effect of the input RF signal summed with the combining signal injected into the source.

Figure 7:
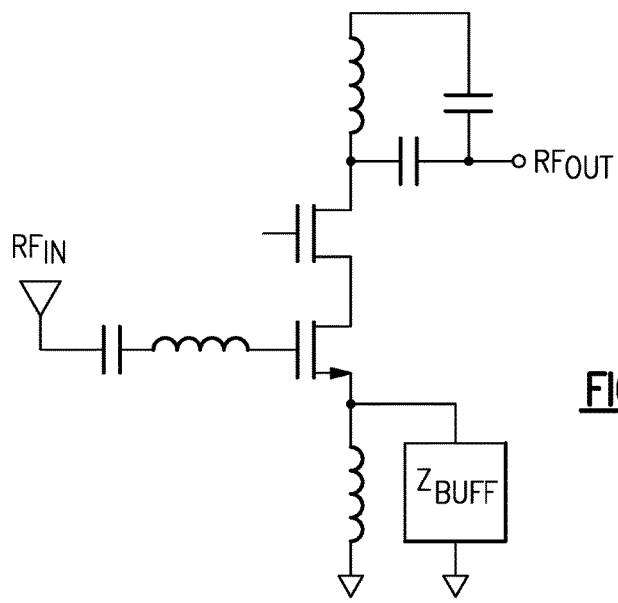
FIG. 7 is a circuit diagram representing an effective impedance seen at an RF input node of a combined amplifier and signal combiner circuit according to one or more embodiments.

FIG. 7 is a circuit diagram representing an effective impedance seen at an RF input node of a combined amplifier and signal combiner circuit according to one or more embodiments. For example, in the circuit of FIG. 5, the impedance seen at the RF input node may be represented by the diagram of FIG. 7. In certain embodiments, if impedance at the source of the common-source transistor (e.g., inductor and/or resistor) approaches zero, the amount of signal that is injected into the circuit may also approach zero.

Figure 8:
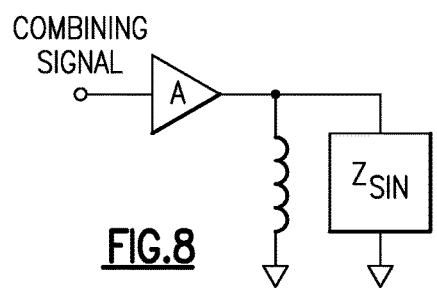
FIG. 8 is a circuit diagram representing an effective impedance at a combining signal input node of a combined amplifier and signal combiner circuit according to one or more embodiments.

FIG. 8 is a circuit diagram representing an effective impedance at a combining signal input node of a combined amplifier and signal combiner circuit according to one or more embodiments. In certain embodiments, the impedance that is seen at the combining signal node may correspond to the amount of signal from the combing signal node that reaches the output node of the circuit.

Examples of Implementations in Products

Figure 9A:
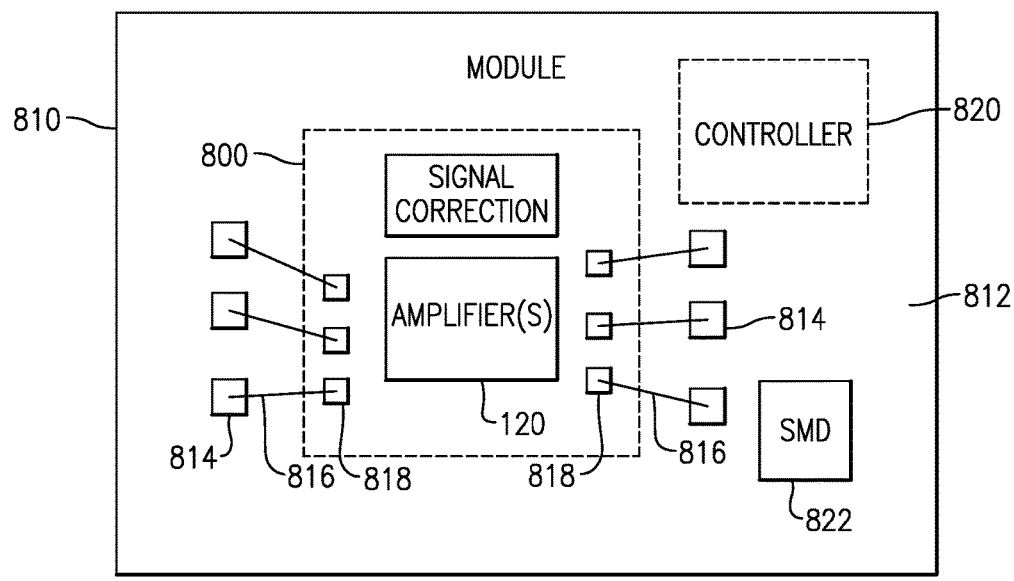
FIGS. 9A and 9B show plan and side views, respectively, of a packaged module having one or more features as described herein according to one or more embodiments.
Figure 9B:
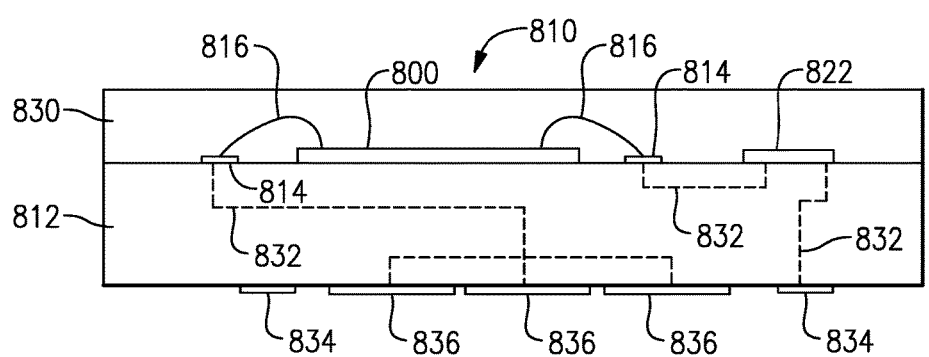

In some embodiments, one or more die having one or more features described herein can be implemented in a packaged module. An example of such a module is shown in FIGS. 9A (plan view) and 9B (side view). A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having one or more combined low-noise amplifiers and signal combiners, as described herein, is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
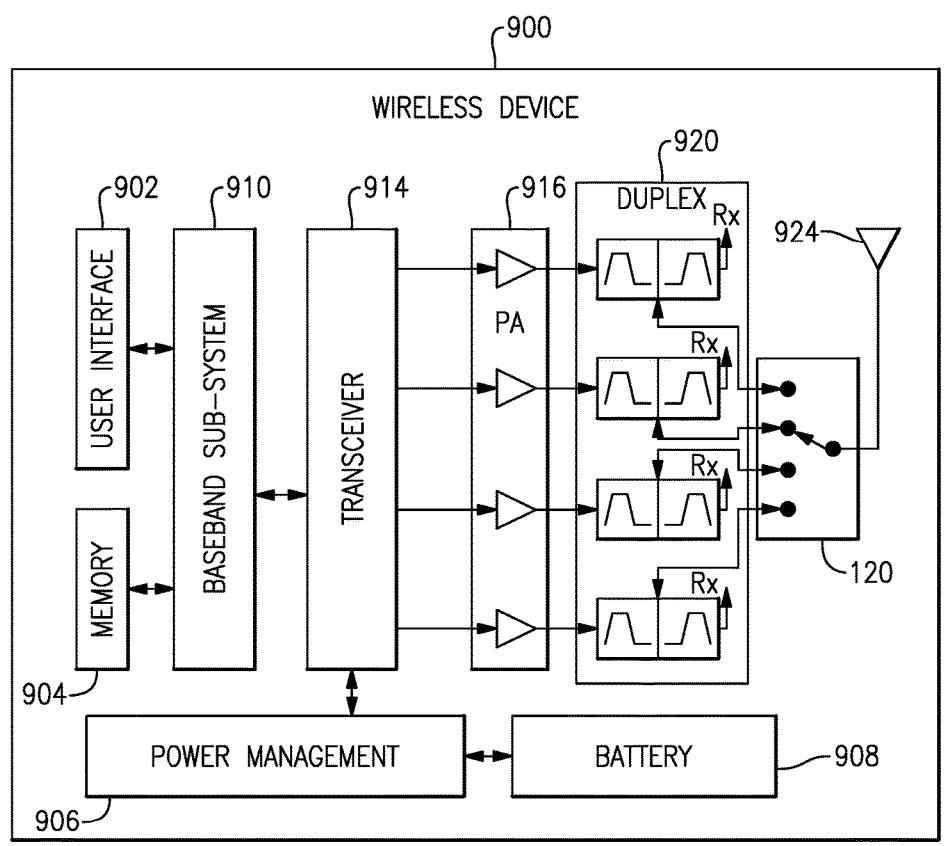
FIG. 10 depicts an example wireless device having one or more advantageous features described herein according to one or more embodiments.

FIG. 10 schematically depicts an example wireless device 900 having one or more advantageous features described herein. The wireless device 900 may include one or more low-noise amplifiers (LNAs) combined with signal combining circuitry, as described in detail herein. For example, the duplexer module 920 may include receiver path(s) associated with one or more LNA/signal combiners.

In the example wireless device 900, a power amplifier (PA) module 916 having a plurality of PAs can provide an amplified RF signal to the switch 120 (via a duplexer 920), and the switch 120 can route the amplified RF signal to an antenna 924. The PA module 916 can receive an unamplified RF signal from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system and/or one or more other components or modules of the device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 910 can allow transmit and receive operations to be performed simultaneously using a common antenna (e.g., 924). In FIG. 10, received signals are shown to be routed to "Rx" paths (not shown) that can include, for example, a low-noise amplifier (LNA) combined with signal combining circuitry, as disclosed herein. A number of other wireless device configurations can utilize one or more features described herein. In another example, a wireless device can include additional antennas such as diversity antenna, and additional connectivity features such as Wi-Fi, Bluetooth, and GPS.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:
   a low-noise amplifier including a common source transistor having a gate node that receives a radio-frequency input signal and a drain node that transmits a combined radio-frequency output signal; and
   a noise-cancellation signal input path configured to receive a radio-frequency noise-cancellation signal and provide the radio frequency noise-cancellation signal to a source node of the common source transistor to cancel a noise signal present in the radio-frequency input signal to generate, at least in part, the combined radio-frequency output signal, the radio frequency noise-cancellation signal being inversely matched to the noise signal at least in part.

2. The radio-frequency module of claim 1, wherein no separate signal combiner is coupled to the gate node.

3. The radio-frequency module of claim 1 further comprising a common gate transistor having a source node coupled to the drain node of the common source transistor and a drain node coupled to a radio-frequency output node.

4. The radio-frequency module of claim 1, wherein the noise-cancellation signal input path includes a buffer amplifier.

5. The radio-frequency module of claim 1, wherein the common source transistor is a Metal Oxide Semiconductor Field Effect Transistor (MOSFET).

6. The radio-frequency module of claim 1 further comprising a first inductor coupled to the gate node of the common source transistor and a second inductor coupled to the source node of the common source transistor in parallel with the noise-cancellation signal input path.

7. A radio-frequency circuit comprising:
a low-noise amplifier including a common source transistor having a gate node that receives a radio-frequency input signal and a drain node that transmits a combined radio-frequency output signal; and
a noise-cancellation signal input path configured to receive a radio-frequency noise-cancellation signal and provide the radio frequency noise-cancellation signal to a source node of the common source transistor to cancel a noise signal present in the radio-frequency input signal to generate, at least in part, the combined radio-frequency output signal, the radio frequency noise-cancellation signal being inversely matched to the noise signal at least in part.

8. The radio-frequency circuit of claim 7, wherein no separate signal combiner is coupled to the gate node of the common source transistor.

9. The radio-frequency circuit of claim 7 further comprising a common gate transistor having a source node coupled to the drain node of the common source transistor and a drain node coupled to a radio-frequency output node.

10. The radio-frequency circuit of claim 7, wherein the noise-cancellation signal input path includes a buffer amplifier.

11. The radio-frequency circuit of claim 7, wherein the common source transistor is a Metal Oxide Semiconductor Field Effect Transistor (MOSFET).

12. The radio-frequency circuit of claim 7 further comprising a first inductor coupled to the gate node of the common source transistor and a second inductor coupled to the source node of the common source transistor in parallel with the noise-cancellation signal input path.

13. A wireless device comprising:
an antenna configured to receive a radio-frequency input signal;
a low-noise amplifier including a common source transistor having a gate node that receives the radio-frequency input signal and a drain node that transmits a combined radio-frequency output signal;
noise-cancellation signal generation circuitry configured to generate a radio-frequency noise-cancellation signal designed to cancel out a noise component of the radio-frequency input signal, the radio frequency noise-cancellation signal being inversely matched to the noise component of the radio-frequency signal at least in part;
a noise-cancellation signal input path configured to receive the radio frequency noise-cancellation signal and provide the radio frequency noise-cancellation signal to a source node of the common source transistor to cancel the noise component to generate, at least in part, the combined radio-frequency output signal; and
a transceiver module configured to receive the combined radio-frequency output signal.

14. The wireless device of claim 13, wherein no separate signal combiner is coupled to the gate node of the common source transistor.

15. The wireless device of claim 13 further comprising a common gate transistor having a source node coupled to the drain node of the common source transistor and a drain node coupled to a radio-frequency output node.

16. The wireless device of claim 13, wherein the noise-cancellation signal input path includes a buffer amplifier.

17. The wireless device of claim 13, wherein the common source transistor is a Metal Oxide Semiconductor Field Effect Transistor (MOSFET).

18. The wireless device of claim 13 further comprising a first inductor coupled to the gate node of the common source transistor and a second inductor coupled to the source node of the common source transistor in parallel with the noise-cancellation signal input path.

* * * * *